United States Patent [19]

Arai et al.

[11] Patent Number: 4,892,759

[45] Date of Patent: Jan. 9, 1990

[54] METHOD FOR SURFACE TREATMENT

[76] Inventors: Tohru Arai, 9-3, Yashiro, Misaki-cho, Toyoake-shi, Aichi-ken; Hiromasa Takeda, Narumi-Shataku 422, 84-1, Aza Otokoyama, Narumi-cho, Midori-ku, Nagoya-shi, Aichi-ken; Hiroyuki Kawaura, Nagakute-ryo 314, 41-3, Aza Yokomichi, Oaza Nagakute, Nagakute-cho, Aichi-gun, Aichi-ken, all of Japan

[21] Appl. No.: 228,423

[22] Filed: Aug. 5, 1988

[30] Foreign Application Priority Data

Aug. 12, 1987 [JP] Japan ................... 62-201330

[51] Int. Cl.$^4$ .................. C23C 16/44; B05D 1/22
[52] U.S. Cl. ................ 427/249; 427/255.2; 427/255.4
[58] Field of Search ............ 427/255.2, 213, 249, 427/255.4; 118/717, DIG. 5, 429

[56] References Cited

U.S. PATENT DOCUMENTS

| | | | |
|---|---|---|---|
| 4,461,656 | 7/1984 | Ross | 148/16.6 |
| 4,569,862 | 2/1986 | Arai et al. | 427/255 |
| 4,623,400 | 11/1986 | Japka et al. | 427/249 |
| 4,686,117 | 8/1987 | Arai et al. | 427/249 |
| 4,786,526 | 11/1988 | Arai et al. | 118/717 X |
| 4,844,949 | 7/1989 | Arai et al. | 118/717 X |

Primary Examiner—Evan Lawrence
Attorney, Agent, or Firm—Berman, Aisenberg & Platt

[57] ABSTRACT

Particles of a layer-forming agent containing at least one element for forming a surface layer of e.g. a carbide on the material to be treated are disposed in a furnace below and/or at the side of the material to be treated. A fluidizing gas is introduced into the furnace below the layer-forming agent for fluidizing a powder of alumina or other refractory material to form a fluidized bed above the layer-forming agent, while the agent is not fluidized. The furnace is heated and a solid halide is supplied into the furnace below the layer-forming agent. The halide is sublimable to produce a gas which activates the element, so that it may combine with a particular element which the material to be treated contains, whereby the surface layer is formed thereon. An apparatus for forming such a surface layer is also provided.

18 Claims, 6 Drawing Sheets

METHOD FOR SURFACE TREATMENT

BACKGROUND OF THE INVENTION

1. Field of the Invention

This invention relates to a method of forming a layer of, for example, the carbide or nitride of chromium or vanadium on the surface of the material to be treated, such as an article made of an alloy of iron, in a fluidized bed furnace, and an apparatus which is used for carrying out the method.

2. Description of the Related Art

There are known methods which employ a fluidized bed to form a carbide or nitride layer on the surface of the material to be treated, as described in Japanese Patent Application No. 213749/1982 (Laid-Open No. 107990/1984) and Japanese Patent Application No. 108054/1984 (Laid-Open No. 251274/1985, U.S. Pat. No. 4,569,862) which cover prior inventions of the inventors of this invention.

These methods employ a treating agent which comprises a fluidized bed-forming refractory powder, such as a powder of alumina; a powder of a layer-forming agent selected from a metal element for forming a carbide or nitride and an alloy thereof; and a powder of an activator selected from an ammonium halide and a metal halide which is sublimable or vaporizable at or below the temperature which is employed for the treatment. The treating agent is fluidized by a fluidizing gas, such as argon, to form a fluidized bed, and the material to be treated is disposed in the fluidized bed, whereby a carbide or nitride is formed on the surface of the material to be treated. A gas of the activator reacts with the layer-forming agent to form a gas of the halide of the element that it consists of, or contains. The halide gas forms a carbide by reacting with carbon in the material to be treated, or a nitride by reacting with nitrogen in the material to be treated (steel), or nitrogen gas which is introduced into the fluidized bed.

It is necessary to employ as the activator a substance which is sublimable or vaporizable at or below the temperature which is employed for the treatment, so that the treating agent may not solidify during its use for the treatment, but may maintain its fluidized state. If the treating agent is used for a long time, its power of forming a surface layer is gradually reduced as a result of a gradual loss of the activator. This is most likely to result in the formation of only a carbide or nitride layer having a smaller thickness with the lapse of time.

A solution to these problems is proposed in Japanese Patent Application No. 159440/1986 (U.S. Pat. No. 4,844,949), which covers another prior invention of the inventors of this invention. According to this prior invention, the treating agent which comprises a fluidizing bed-forming powder and a powder of a layer-forming agent is fluidized to form a fluidized bed, the material to be treated is disposed in the fluidized bed, and the activator is supplied from outside into the furnace, whereby a carbide or the like is formed on the surface of the material to be treated. This method in which the activator is supplied from outside, makes it possible to maintain the layer-forming ability and to carry out an efficient continuous treatment. However, since this method uses the layer-forming agent in powder form, such agent when fluidized is likely to adhere to the surface of the material to be treated, resulting in the degradation of the surface smoothness.

SUMMARY OF THE INVENTION

Under these circumstances, it is an object of this invention to provide a method which can establish a fluidized bed maintaining a high power of forming a surface layer for a long period of time, thereby enabling continuous operation for surface treatment, while preventing any powder from adhering to the surface of the material to be treated.

This object can be attained by a method which comprises:

disposing in a fluidized bed furnace a mass of particles of a layer-forming agent containing at least one element for forming the surface layer below and/or at the side of the material to be treated in a manner not to contact the material to be treated;

disposing in the fluidized bed furnace a powder of alumina or other refractory material for forming a fluidized bed;

introducing a fluidizing gas into the fluidized bed furnace to fluidize the powder of alumina or other refractory material and to form a fluidized bed;

disposing the material to be treated in the fluidized bed; and introducing from outside the fluidized bed furnace a halide as an activator for the layer forming agent into the furnace below the layer-forming agent, thereby forming under heating a layer of a carbide, nitride or carbonitride, or a mixture thereof, or a solid solution thereof on the surface of the material to be treated. This method may further comprise supplying nitrogen-containing gas into the furnace.

It is another object of this invention to provide an apparatus which is used for carrying out the method of this invention.

This object can be attained by an apparatus which comprises:

a fluidized bed furnace for containing a mass of particles of a layer-forming agent containing an element for forming a surface layer and to be disposed below and/or at the side of the material to be treated, and a powder of alumina or other refractory material for forming a fluidized bed, the furnace having a gas inlet through which a fluidizing gas is introduced into the furnace, and a gas outlet;

heating means for heating the fluidized bed; and activator supplying means in communication with the outside of the furnace body, for supplying an activator into the furnace below the layer-forming agent. The apparatus may further comprise nitrogen-containing gas supplying means for supplying such gas into the furnace.

According to this invention, the layer-forming agent is in form of a mass of particles and is not fluidized, and it is disposed in a manner not to contact the material to be treated. Therefore, no particle of the layer-forming agent adheres to the surface of the material to be treated. A halide as the activator is in solid form or the like and is supplied from a source of supply situated outside the furnace below the layer-forming agent from time to time when required. It is no longer necessary to mix the fluidized bed-forming powder, the layer-forming agent and the activator. These features enable the continuous performance of surface treatment. The layer-forming agent in particulate or granular form has a longer life than any layer-forming agent in powder form.

A vessel which is, for example, formed from a net of stainless steel wire is preferably employed for holding the layer-forming agent, as it facilitates the separation of the layer-forming agent from the fluidized bed-forming powder and thereby enables the change of only the layer-forming agent whenever necessary. As the activator is supplied into the furnace little by little, only a limited amount of halide gas leaves the furnace and only a small and simple apparatus is, therefore, required for disposing of waste gas. As the layer-forming agent has a long life, it is possible to save the consumption of any expensive metal, such as titanium or vanadium.

This invention also enables the continuous surface treatment of a plurality of materials by employing an automatic charging and discharging device of the type which is employed for any ordinary heat treatment work using a fluidized bed.

Further, according to this invention, the nitrogen-containing gas may be introduced in a manner not to contact the layer-forming agent, which prevents degradation of the layer-forming agent.

Other features and advantages of this invention will become apparent from the following description and the accompanying drawings.

DETAILED DESCRIPTION OF THE INVENTION

Figure 1:
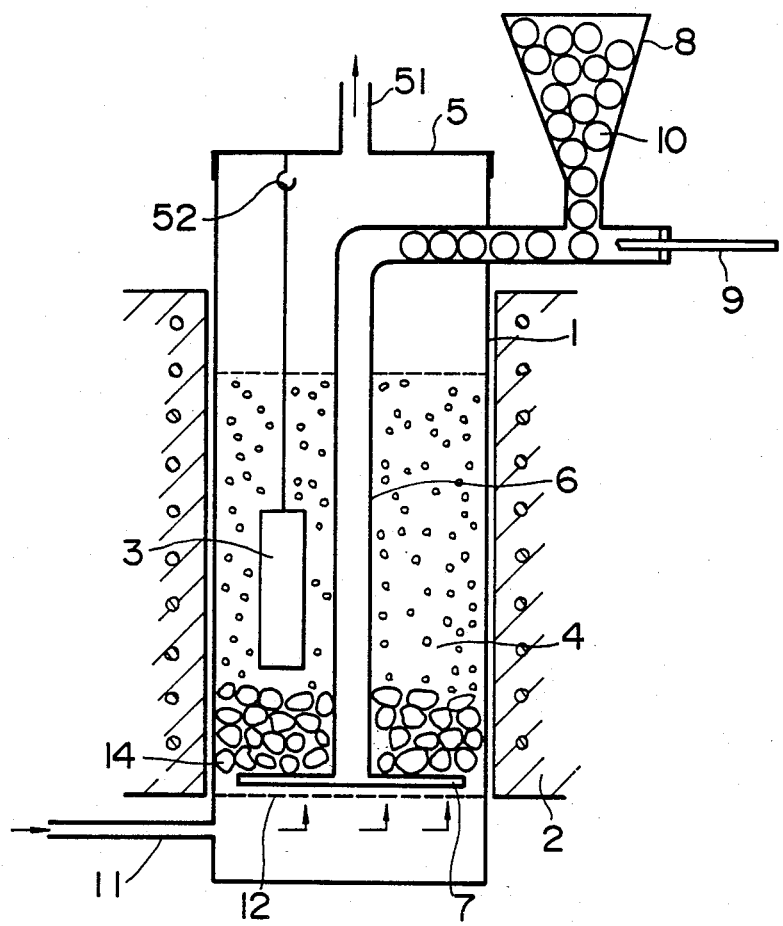
FIGS. 1 and 6 are schematic vertical sectional views of an apparatus embodying this invention.

The layer-forming agent which is employed by this invention may comprise a metal element which can easily combine with carbon or nitrogen, or both, to form a carbide or nitride, or carbonitride, or an alloy containing any such element. Typical examples of the appropriate elements are titanium (Ti), zirconium (Zr) and hafnium (Hf), which are the elements of Group IVa of the periodic table, vanadium (V), niobium (Nb) and tantalum (Ta), which are the elements of Group Va, chromium (Cr), molybdenum (Mo) and tungsten (W), which are the elements of Group VIa, and manganese (Mn), which is an element of Group VIIa. Titanium and chromium are typical of the metals which can easily form a solid solution with an element which the material to be treated contains, when it is desirable to form a surface layer composed of any such solid solution. Examples of the alloys which can be employed are ferroalloys, such as Fe-V, Fe-Nb and Fe-Cr. The layer-forming agent may be a mixture of two or more different metals or alloys to form a composite surface layer or two or more carbide or nitride layers.

The particles of the layer-forming agent are preferably so sized as not to be fluidized by a fluidizing gas. It is preferable to employ particles having a size of 5 to 20 mesh. However, particles of a smaller size may also be used if they are put into a porous vessel or the like (not shown). If the layer-forming agent blocks the gas inlet, the fluidizing gas fails to flow into the furnace satisfactorily to form a satisfactorily fluidized bed. This kind of trouble can be avoided if coarse grains of alumina or other refractory material having a size of 5 to 20 mesh are disposed between the gas inlet and the layer-forming agent. The particles of the layer-forming agent are disposed below and/or at the side of the material to be treated in a manner not to contact the material, or with the aid of a porous vessel formed from a net of steel wire, or like material which permits the free passage of gas alone therethrough. The use of such a vessel facilitates the handling of the layer-forming agent when it is put into, or out of, the furnace. The surface layer of, e.g., a carbide is formed when the halide gas resulting from the reaction of the activator with the layer-forming agent reacts with the material to be treated. Therefore, the layer-forming agent is required in such a quantity as to enable the formation of a sufficiently large amount of halide gas. This quantity usually ranges from 2 to 80% by weight of the fluidized bed-forming powder, but it is preferably from 10 to 20% if the cost of the agent is, for example, taken into account.

A carbide or carbonitride is formed on the material to be treated if it is, for example, a metal containing carbon, such as iron, nickel or cobalt, an ultrahard alloy, or a carbonaceous material, such as graphite. The carbide is formed on the surface of the material to be treated when the corresponding element which the layer-forming agent contains combines with the carbon which the material to be treated contains. It is desirable for the effective formation of a carbide layer that the material to be treated contain at least 0.2% of carbon. If it contains only less than 0.2% of carbon, it may be difficult to form any carbide layer, or it may take an unduly long time to form a carbide layer having a practically satisfactory thickness. Even if the material to be treated is a metal not containing carbon, a carbide layer can be formed thereon if it is carburized prior to the surface treatment according to this invention. This carburization can be performed by employing either a separate furnace, or the fluidized bed furnace which is employed for the surface treatment according to this invention. If the fluidized bed furnace is employed, nitrogen or argon gas containing methanol, etc., is, for example, supplied into the furnace for carrying out carburization in a customary way, and argon gas and the activator are, then, supplied for carrying out the surface treatment according to this invention.

A nitride layer can be formed on, for example, various kinds of metals including iron, nickel and cobalt, ultrahard alloys, or nonmetallic materials including sintered products of oxide, such as alumina. The material to be treated does not necessarily need to contain carbon if a nitride layer is to be formed thereon. Gas containing nitrogen is used as a fluidizing gas, so that a nitride may be formed on the surface of the material to be treated when the corresponding element which the layer-forming agent contains combines with the nitrogen which the gas contains. A carbonitride layer is formed on the material to be treated if it contains carbon.

A carbide or nitride layer can also be formed on a nitrided alloy of iron. The carbide layer which is formed thereon is one which contains nitrogen, and the nitride layer can be formed, even if no fluidizing gas containing nitrogen is employed.

A layer of a solid solution can be formed on a metal or alloy not containing carbon, such as iron or stainless steel. If neither the material to be treated nor the gas which is employed contains a sufficiently large amount of carbon or nitrogen, a particular element which the layer-forming agent contains diffuses into the material to be treated to form a solid solution, as is well known in the art.

The activator may comprise one or more halides selected from among the halide compounds, ammonium halides, metal halides and alkali metal or alkaline-earth metal halides, which are sublimable, vaporizable or meltable at or below the temperature which is employed for the surface treatment. The activator may have a melting point which is higher or lower than the treating temperature. The activator is employed in solid, liquid or gas form and is usually supplied little by little into the furnace, though it may also be added to the fluidized bed-forming powder before the operation for surface treatment is started. Examples of the halide compounds are HCL and the like. Examples of the ammonium halides are $NH_4Cl$, $NH_4Br$, $NH_4F$, $NH_4I$ and $NH_4BF_4$. Examples of the metal halides are $TiF_4$, $VCl_3$, $VF_3$ and $FeCl_3$. Examples of the alkali metal or alkaline earth metal halides are NaCl, KCl, $KBF_4$ and $NaBF_4$. It is desirable for the formation of a surface layer having a satisfactory thickness that each amount of the activator that is supplied from time to time be in the range of 0.01 to 20% of the total amount of the fluidized bed-forming powder and the layer-forming agent. This amount of activator is supplied at regular or irregular intervals of, say, one minute to four hours. If it is less than 0.01%, it is necessary to increase the frequency with which the activator has to be supplied. If it is over 20%, a greater amount of gas is produced and the clogging of a pipeline or other trouble is likely to occur. It is, however, effective to supply a relatively small amount of activator in the range of, say, 0.1 to 0.2% as often as almost continuously in order to reduce the amount of waste gas which is produced, so that it may be sufficient to use a small and simple apparatus for disposing of waste gas.

The activator is supplied from a source of supply which is located outside the furnace. There is no particular limitation to the shape of the activator insofar as it is sublimable, vaporizable or meltable at the treating temperature. However, it is usually employed in the form of pellets, cylindrical pieces or blocks, as these shapes are easy to handle. A device which can be used for supplying the activator is shown by way of example in FIGS. 1 to 3. It comprises an activator supply pipe 6 and a plurality of radially extending pipes 7 through which a gas of the activator is jetted out into the furnace. The pipes 7 are situated below the layer-forming agent. Every two adjoining pipes 7 have an equal angular distance therebetween to ensure the uniform distribution of the activator gas across the furnace.

Figure 3:
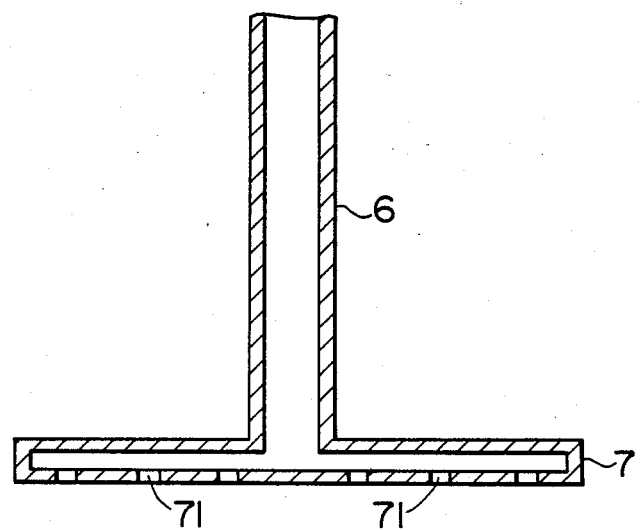
FIG. 3 is a sectional view taken along the line III—III of FIG. 2.

The uniformity of fluidization is difficult to maintain if the pipes 7 occupy too large an area in the furnace. In this connection, it is desirable that B/A not exceed $\frac{1}{3}$, where "A" stands for the cross sectional area of the furnace and "B" stands for the total cross sectional area of the pipes 6 and 7. Insofar as this relationship can be maintained, it is possible to use any number of pipes 7 having any diameter. The pipes 6 and 7 may have a circular, oval or square shape in cross section. The pipes 7 are preferably so sized and arranged as to be symmetric with respect to the center of the furnace. Each pipe 7 is provided at its bottom with a plurality of apertures 71 through which the activator gas can be jetted out, as shown in FIG. 3. The number, diameter and distribution of the apertures are so selected as to ensure the uniform distribution of the gas through the fluidized bed. The uniform density of the activator gas can, for example, be maintained across the fluidized bed if each pipe 7 is provided with a larger number of apertures having a larger diameter towards its end remote from the central pipe 6 than towards its end close to it.

Figure 4:
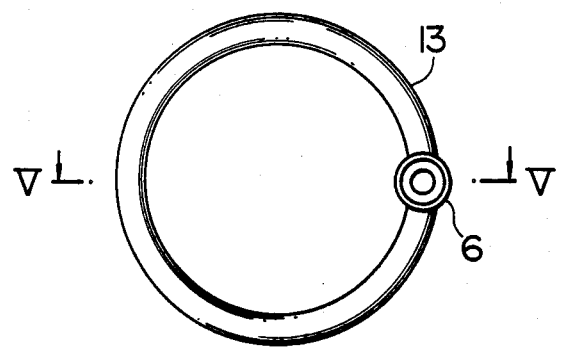
FIG. 4 is a top plan view of a different form of tubular device for supplying an activator.
Figure 5:
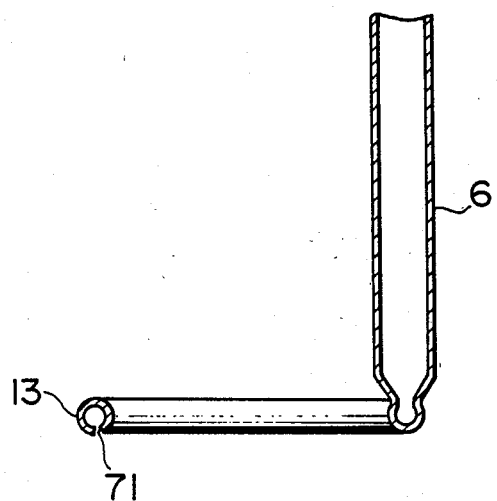
FIG. 5 is a sectional view taken along the line V—V of FIG. 4.

The pipes 7 can be replaced by a single circular pipe 13 to which an activator supply pipe 6 is connected, and which is provided at its bottom with an appropriate number of apertures 71, as shown in FIGS. 4 and 5.

The activator supply pipe 6 has an upper or outer end located outside the furnace, while its lower or inner end is connected to the pipes 7, as shown by way of example in FIG. 1. In the case of a solid activator, a hopper 8 is connected to the pipe 6 outside the furnace and holds the solid activator in the form of, for example, pellets 10. The pellets 10 drop from the hopper 8 into the horizontal portion of the pipe 6 and are pushed by a rod 9 to drop into the vertical portion of the pipe 6. The outer end of the pipe 6 through which the rod 9 is inserted is closed to prevent the outflow of the activator and the leakage of any ambient air into the furnace.

The activator which has dropped into the vertical portion of the pipe 6 exposed to a high temperature forms a gas by sublimation or vaporization and the resulting expansion of its volume forces the gas to jet out through the apertures 71 of the pipes 7. An inert gas can, for example, be introduced into the pipe 6 if required to promote the flow of the activator gas out of the pipes 7.

FIG. 1 also shows a gas distributor 12 which is provided below the pipes 7 for distributing the fluidizing gas uniformly. The pipes 7 can alternatively be situated below the gas distributor 12. It is also possible to locate substantially the whole of the pipe 6 outside the furnace 1 if it can be appropriately heated. Alternatively, it is possible to provide a heater for heating that portion of the pipe 6 which is situated outside the furnace 1, so that the activator may be gasified before it is introduced into the furnace.

The fluidized bed can be formed by a powder of any refractory material that is usually employed to form a fluidized bed in a heat treating furnace, if it does not react with any metal composing the material to be treated. Examples of the appropriate materials include alumina ($Al_2O_3$), silicon oxide ($SiO_2$), titanium oxide ($TiO_2$) and zirconia ($ZrO_2$). One or more refractory materials are employed. The powder preferably has a grain size of 60 to 200 mesh, as is the base with the powder which is usually employed to form a fluidized bed in a heat treating furnace. Any powder having a grain size which is finer than 200 mesh is difficult to handle and fluidize uniformly. The use of any powder having a grain size which is coarser than 60 mesh is not recommended, either, as its fluidization requires a larger amount of gas.

An inert gas, such as argon gas, is used to form a fluidized bed if it is used to form a carbide layer on the material to be treated, while nitrogen-containing gas or a mixture thereof with argon gas is used if the bed is used to form a nitride layer. The fluidizing gas may contain a small amount of hydrogen.

The fluidizing gas is supplied so as to flow through the furnace at a sufficiently high velocity to maintain a good state of fluidization. If its velocity is too low, the insufficiency of fluidization results in a fluidized bed having a poor temperature distribution. However, the use of too high a velocity must also be avoided, since it means an undesirably large consumption of gas and is also likely to cause inconveniences which make any stable operation of the furnace difficult, including the heavy bubbling of gas and the flotation of particles of the layer-forming agent.

The fluidizing gas raises the refractory powder in the furnace and the pressure of the gas which is continuously supplied into the furnace keeps it from falling and thereby makes it possible to form a fluidized bed moving in a state of suspension.

The fluidized bed furnace which is employed for carrying out this invention may be of any common type and is shown by way of example in FIG. 1. It comprises a furnace body 1 having an inlet 11 for the fluidizing gas near its bottom and a removable top cover 5 having a gas outlet 51. The gas distributor 12 which has hereinbefore been mentioned is situated immediately above the gas inlet 11. The furnace may alternatively have a cover attached permanently to a main body provided with a door through which the activator supply pipes, the material to be treated, etc., are put into, or out of, the furnace.

The treating temperature is selected from the range of 700° C. to 1200° C. If it is lower than 700° C., an undesirably long time is required for forming a layer. The use of any temperature exceeding 1200° C. must also be avoided, as it is likely to exert an adverse effect on the properties of the material to be treated. It is, however, possible to employ a lower temperature, though preferably in the range of 400° C. to 1200° C., when the material to be treated is a nitrided alloy of iron which already carries an iron nitride (or carbonitride if the alloy contains carbon) layer. In this particular case, the halide gas which is produced by the reaction of the activator and the layer-forming agent causes the diffusion of a relevant layer-forming element into the nitride (or carbonitride) on the alloy and thereby the substitution thereof for iron to form its own nitride (or carbonitride).

The length of time which is employed for the treatment is selected from the range of 0.5 to five hours, but depends on the composition required of the layer to be formed, its desired thickness, etc. It is generally true that the formation of a layer having a certain thickness requires only a relatively short time if a high temperature is employed, but requires a relatively long time if a low temperature is employed.

Figure 9:
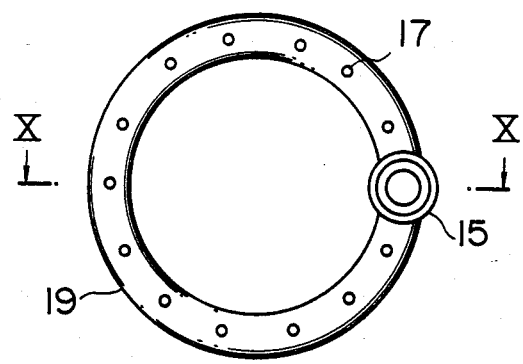
FIG. 9 is a top plan view of a different form of tubular device for supplying a nitrogen-containing gas.
Figure 10:
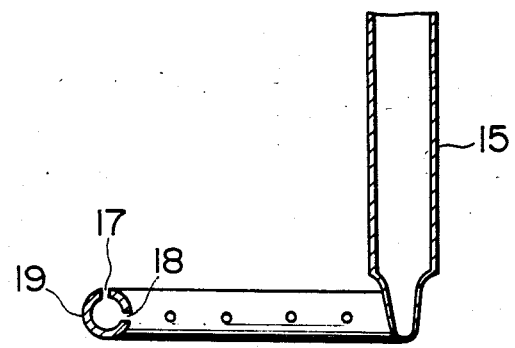
FIG. 10 is a sectional view taken along the line X—X of FIG. 9.

When nitrogen-containing gas is supplied from the gas inlet 11 for forming a nitride layer, the layer-forming agent will be gradually nitrified and its layer-forming ability will be reduced as a result of repeated treatment. In order to prevent the nitrification of the layer-forming agent and to enable the semipermanent use of the layer-forming agent, the nitrogen-containing gas may be supplied in a manner not to contact the layer-forming agent. For example, the nitrogen-containing gas may be supplied through gas supply pipe 15 and extending pipes 16 shown in FIG. 6. The gas is supplied through extending pipes 16 below and/or at the side of the material to be treated in a manner not to contact the layer-forming agent. The extending pipes are provided with a plurality of upward apertures 17 through which the nitrogen-containing gas is jetted out. The pipe 16 may be replaced by a single circular pipe 19 provided with an appropriate number of apertures 17 and 18 on the upper surface and the inner side surface, as shown in FIGS. 9 and 10. The cross sectional area of pipes 16 and 19 are similar to that of extending pipes 7 for the activator. As to a velocity of the nitrogen-containing gas, the velocity for forming a nitride layer will be sufficient.

The invention will now be described more specifically with reference to a number of examples thereof.

EXAMPLE 1

The fluidized bed furnace as shown in FIG. 1, of which the outline has already been described, was used for forming a carbide layer on the surface of a bar of alloy tool steel known as SKD11 having a diameter of pv 7 mm and a length of 50 mm. The furnace 1 had a cylindrical wall made of heat resistant steel and having a diameter of 60 mm and a height of 800 mm. It was surrounded by a heater 2. The gas outlet 51 was connected to a scrubber for trapping waste gas leaving the furnace.

The furnace 1 was charged with 400 g of particles of ferrovanadium containing 70% of vanadium and having a size of 8 to 16 mesh as the non-fluidizable layer-forming agent 14 occupying a bottom portion of the furnace immediately above the gas distributor 12. The furnace 1 was, then, charged with 600 g of a powder of alumina having a grain size of 80 to 100 mesh as the fluidized bed-forming powder occupying a portion of the furnace above the layer-forming agent 14.

Figure 2:
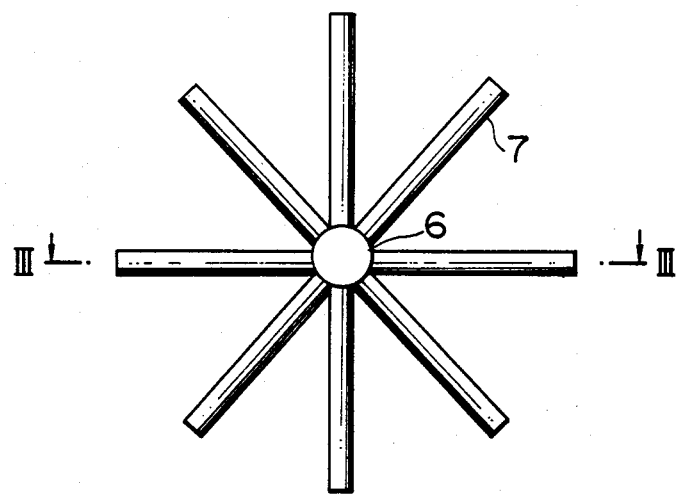
FIG. 2 is top plan view of a tubular device for supplying an activator.

The activator supply pipe 6 extending through the alumina powder and the layer-forming agent 14 had an inside diameter of 10 mm and its lower end was connected to eight halide gas distributing pipes 7 located between the gas distributor 12 and the layer-forming agent 14 as shown in FIG. 1, and radially outwardly extending from the pipe 6 as shown in FIG. 2. Each pipe 7 was provided at its bottom with three apertures 71 each having a diameter of 0.5 mm.

Argon gas having a pressure of 1.5 kg/cm$^2$ was introduced into the furnace 1 through its gas inlet 11 at a velocity of 140 cm per minute, whereby the alumina powder was fluidized to form a fluidized bed 4. The alloy tool steel bar 3, which was employed as the material to be treated, was suspended from a hook 52 provided on the inner surface of the cover 5 and the cover 5 was placed to close the furnace 1 tightly, whereby the bar 3 was dipped substantially in the center of the fluidized bed 4. The heater 2 was started to heat the fluidized bed 4 to a temperature of 1000° C.

Solid cylindrical pieces of ammonium chloride, each having a diameter of 7 mm, a length of 7 mm and a weight of 0.5 g, were employed as the activator. One piece 10 of activator was caused to drop from the horizontal portion of the pipe 6 into its vertical portion every six minutes by the rod 9 which was used to push the pieces 10 dropping from the hopper 8 having a closed upper end and a lower end connected to the pipe 6.

The operation for surface treatment as hereinabove described was continued for two hours. The bar 3 was removed from the furnace 1 and its surface was visually inspected. It was a smooth surface which was free from any undesirable substance adhering to it and any unevenness in color. The cross sectional examination of bar 3 by a microscope revealed the presence of a uniform surface layer having a thickness of three to four micrometers. The analysis of the layer by X-ray diffraction confirmed that it was a layer of vanadium carbide (VC). It had a hardness of about $H_v$ 3000 (Vickers hardness).

The results which were obtained confirm that if the activator is supplied at certain intervals of time, it is possible to form a layer of vanadium carbide having a satisfactory thickness, even if the layer-forming agent may not be fluidized.

EXAMPLE 2

The procedures of EXAMPLE 1 were followed to form a carbide layer, except that the layer-forming agent was replaced by 400 g of particles of ferrotitanium having a size of 8 to 16 mesh, and that a bar of carbon tool steel known as SK4 having a diameter of 7 mm and a length of 50 mm was employed as the material to be treated. After two hours of treatment, the bar was removed from the furnace, and quenched in oil.

The examination of the bar indicated the presence of a surface layer free from any undesirably adhering substance and having a thickness of six to seven micrometers. The analysis of the layer by X-ray diffraction confirmed that it was a layer of titanium carbide (TiC). It had a hardness of about $H_v$ 3500.

EXAMPLE 3

The procedures of EXAMPLE 1 were followed to form a carbide layer, except that a cylindrical vessel formed from a net of stainless steel wire and having an outside diameter of 45 mm, an inside diameter of 30 mm and a height of 100 mm was employed for holding 200 g of chromium particles having a size of 8 to 16 mesh as the layer-forming agent, and that 800 g of a powder of alumina having a grain size of 80 to 100 mesh as the fluidized bed-forming powder was disposed above the layer-forming agent. A bar of carbon tool steel known as SK4 having a diameter of 7 mm and a length of 50 mm was employed as the material to be treated. After two hours of treatment, the bar was removed from the furnace and quenched in oil.

The bar had very smooth surface free from any undesirably adhering matter and was coated with a layer having a thickness of six to seven micrometers. The analysis of the layer by X-ray diffraction confirmed that it was a layer of chromium carbide ($Cr_7C_3 + Cr_{23}C_6$). It had a hardness of about $H_v$ 2000.

EXAMPLE 4

Figure 6:
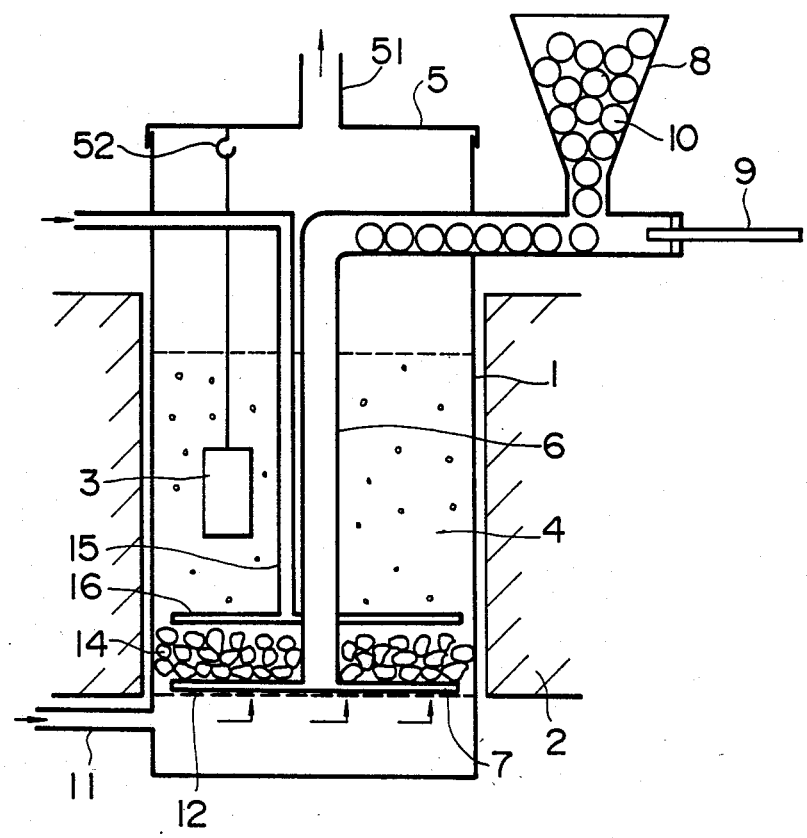
Figure 7:
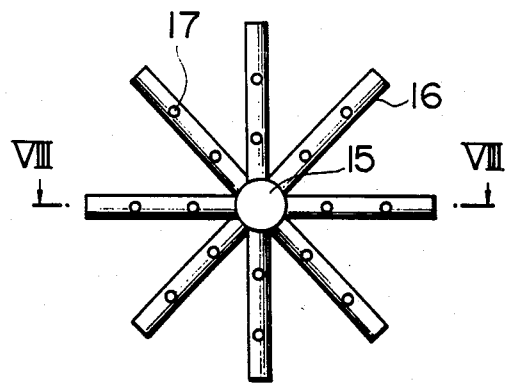
FIG. 7 is top plan view of a tubular device for supplying a nitrogen-containing gas.
Figure 8:
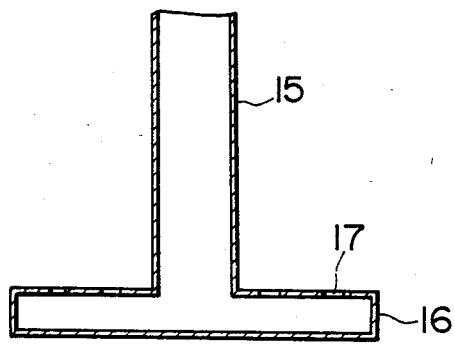
FIG. 8 is a sectional view taken along the line VIII—VIII of FIG. 7.

The fluidized bed furnace as shown in FIG. 6 was used for forming a nitride layer. This fluidized bed furnace is almost similar to the furnace of EXAMPLE 1 as shown in FIG. 1, except that the eight extending pipes 16 were disposed above the activator and connected to the nitrogen-containing gas supply pipe 15 having an inside diameter of 5 mm.

The nitrogen-containing gas having a pressure of 2 $kg/cm^2$ was introduced into the furnace at a velocity of 1200 cm per minute. Each extending pipe 16 was provided with three apertures 17 and 18 each having a diameter of 0.5 mm. The composition and amount of the fluidized bed-forming powder and layer-forming agent, and the pressure and amount of the fluidized gas are similar to those of EXAMPLE 1.

The alloy tool steel bar 3 (SK4 and SK11 having a diameter of 7 mm and a length of 50 mm), which was employed as the material to be treated, was suspended from a hook 52 provided on the inner surface of the cover 5 and the cover 5 was placed to close the furnace 1 tightly, whereby the bar 3 was dipped substantially in the center of the fluidized bed 4. The heater 2 was started to heat the fluidized bed 4 to a temperature of 1000° C.

The pellets of ammonium chloride having a weight of 0.1 g were employed as the activator. One piece 10 of activator was caused to drop from the horizontal portion of the pipe 6 into its vertical portion every two minutes by the rod 9 which was used to push the pieces 10 dropping from the hopper 8 having a closed upper end and a lower end connected to the pipe 6.

The operation for surface treatment as hereinabove described was continued for two hours. The bar 3 was removed from the furnace 1 and its surface was visually inspected. It was a smooth surface which was free from any undesirable substance adhering to it and any unevenness in color. The cross sectional examination of the bar 3 by a microscope revealed the presence of a uniform surface layer having a thickness of six to seven micrometers in SK4, and four to five micrometers in SK11. The analysis of the layer by X-ray diffraction and X-ray micranalyser confirmed that it was a layer of vanadium carbonitride (V(NC)) containing a small amount of carbon. It had a hardness of about $H_v$ 2400 (Vickers hardness).

EXAMPLE 5

The procedures of EXAMPLE 1 were followed to form a nitride layer. 600 g of alumina powder (80 to 100 mesh), 400 g of particles of ferrotitanium (8 to 16 mesh), and a bar of carbon tool steel (known as SK4 and SKD11 having a diameter of 7 mm and a length of 50 mm) were employed. The fluidized bed was heated to a temperature of 1000° C. Then, pellets of ammonium chloride were used as the activator. After two hours of treatment, the bar was removed from the furnace, and quenched in oil.

The examination of the bar indicated the presence of a surface layer free from any undesirably adhering substance and having a thickness of six to seven micrometers in SK4, and five to six micrometers in SKD11. The analysis of the layer by X-ray diffraction and X-ray micranalyser confirmed that it was a layer of titanium carbonitride (Ti(NC)) containing a small amount of carbon. It had a hardness of about $H_v$ 3200.

What is claimed is:

1. A method for forming, on a material to be treated, a surface layer of a carbide, nitride or carbonitride, or a mixture thereof, or a solid solution thereof, which method comprises:
    disposing in a fluidized bed furnace a mass of particles of a layer-forming agent, containing at least one element for forming the surface layer, below and/or at the side of the material to be treated in a manner not to contact said material to be treated;
    disposing in said fluidized bed furnace a powder of alumina or other refractory material as a fluidizing agent for forming a fluidized bed;
    introducing a fluidizing gas into the fluidized bed furnace to fluidize said powder of alumina or other refractory material and to form a fluidized bed;
    disposing said material to be treated in said fluidized bed; and introducing from outside the fluidized bed furnace a halide as an activator for said layer-forming agent into said furnace below said layer-forming agent, thereby forming under heating a layer of a carbide, nitride or carbonitride, or a mixture thereof, or a solid solution thereof on the surface of the material to be treated.

2. A method according to claim 1, wherein said layer-forming agent comprises a metal or alloy of at least one member selected from the group consisting of titanium, zirconium, hafnium, vanadium, niobium, tantalum, chromium, molybdenum, tungsten, and manganese, the amount of said layer-forming agent being 2 to 80 weight % based on said fluidizing agent.

3. A method according to claim 1, wherein said particles of said layer-forming agent have a size of 5 to 20 mesh.

4. A method according to claim 1, wherein said activator comprises at least one member selected from the group consisting of ammonium halides, metal halides, and alkali metal or alkaline-earth metal halides, the amount of said activator being 0.01 to 20 weight % based on said fluidizing agent and layer-forming agent.

5. A method according to claim 1, wherein said fluidizing gas is a nitrogen gas, a nitrogen-containing gas or a mixture of said nitrogen or nitrogen-containing gas and argon, thereby forming the nitride or carbonitride layer on the surface of said material to be treated.

6. A method according to claim 1, wherein said fluidizing gas is an inert gas, thereby forming the carbide or solid-solution layer on the surface of said material to be treated.

7. A method according to claim 1, wherein said heating is carried out at a temperature of 400° C. to 1200° C.

8. A method according to claim 1, wherein said layer-forming agent comprises a metal or alloy of said element for forming a carbide or carbonitride layer, and
said material to be treated is one of a metal material containing carbon, cemented carbide, and a carbonaceous material mainly composed of graphite,
thereby forming the carbide or carbonitride layer on the surface of said material to be treated.

9. A method according to claim 8, wherein said material to be treated is one of iron, nickel and cobalt containing carbon.

10. A method according to claim 1, wherein said layer-forming agent comprises a metal or alloy of said element for forming a nitride layer, and
said material to be created is one of a metal material or a non-metal material,
thereby forming the nitride layer on the surface of said material to be treated.

11. A method according to claim 10, wherein said material to be treated is one of iron, nickel, cobalt and sintered ceramics.

12. A method according to claim 1, wherein said layer-forming agent comprises a metal or alloy of said element for forming a solid-solution layer and,
said material to be treated is a metal material not containing carbon,
thereby forming the solid-solution layer on the surface of said material to be treated.

13. A method according to claim 12, wherein said material to be treated is one of iron and stainless steel not containing carbon.

14. A method according claim 1, wherein said layer-forming agent comprises a metal or alloy of said element for forming a nitride or carbonitride layer, and
said material to be treated is a metal material subjected to a nitriding treatment,
thereby forming the nitride or carbonitride layer on the surface of said material to be treated.

15. A method according to claim 1, wherein further activator is added to said layer-forming agent prior to said step of introducing said activator below the layer-forming agent.

16. A method according to claim 1, further comprising a step of supplying a nitrogen-containing gas below and/or at the side of said material to be treated in a manner not to contact said layer-forming agent.

17. A method according to claim 16, wherein further activator is added to said layer-forming agent, prior to said step of introducing said activator below the layer-forming agent.

18. A method according to claim 1, wherein said particles of the layer-forming agent are put into a porous vessel prior to being disposed in the fluidized bed furnace.

* * * * *